(12) United States Patent
Takii

(10) Patent No.: US 9,685,641 B2
(45) Date of Patent: Jun. 20, 2017

(54) SOLUTION-PROVIDING APPARATUS AND METHOD OF MANUFACTURING ORGANIC LIGHT-EMITTING DIODE (OLED) DISPLAY USING THE APPARATUS

(71) Applicant: Samsung Display Co., Ltd., Yongin-si, Gyeonggi-do (KR)

(72) Inventor: Kenji Takii, Suwon-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/275,049

(22) Filed: Sep. 23, 2016

(65) Prior Publication Data
US 2017/0012248 A1 Jan. 12, 2017

Related U.S. Application Data

(62) Division of application No. 14/493,223, filed on Sep. 22, 2014, now Pat. No. 9,457,365.

(30) Foreign Application Priority Data

Feb. 12, 2014 (KR) .................. 10-2014-0016144

(51) Int. Cl.
*H01L 51/00* (2006.01)
*H01L 51/56* (2006.01)
(Continued)

(52) U.S. Cl.
CPC ............... *H01L 51/56* (2013.01); *B05B 5/00* (2013.01); *B05B 12/08* (2013.01);
(Continued)

(58) Field of Classification Search
CPC ......... H01L 2924/00; H01L 2924/0002; H01L 21/02628; H01L 23/49883;
(Continued)

(56) References Cited

U.S. PATENT DOCUMENTS 6,087,196 A * 7/2000 Sturm ................. H01L 51/0001
427/466
2011/0177489 A1* 7/2011 Takahashi ............. B01L 3/0262
435/3

(Continued)

FOREIGN PATENT DOCUMENTS

JP       2005-186398 A    7/2005
JP       2010-010025 A    1/2010
(Continued)

*Primary Examiner* — Jaehwan Oh
(74) *Attorney, Agent, or Firm* — Knobbe Martens Olson & Bear LLP

(57) ABSTRACT

A solution-providing apparatus and method of manufacturing organic light-emitting diode (OLED) display using the apparatus are disclosed. In one aspect, the apparatus comprises a storage unit, a spraying unit, a pipe, an emission-inducing unit, and a spectrometer. The storage unit is configured to store the solution that includes a light emissive material. The spraying unit is configured to spray the solution toward the substrate. The pipe interconnects the storage unit and the spraying unit. The emission-inducing unit is configured to excite the light emissive material of the solution that flows through the pipe so as to emit light from the solution. The spectrometer is configured to measure the wavelength and intensity of the light.

9 Claims, 12 Drawing Sheets

(51) Int. Cl.
*B05B 12/08* (2006.01)
*B05B 5/00* (2006.01)
*H01L 51/50* (2006.01)
*H01L 27/32* (2006.01)

(52) U.S. Cl.
CPC ...... *H01L 51/0003* (2013.01); *H01L 51/0031* (2013.01); *H01L 27/3244* (2013.01); *H01L 51/5012* (2013.01); *H01L 2251/558* (2013.01)

(58) Field of Classification Search
CPC ............. H01L 21/02601; H01L 33/502; H01L 41/317; H01L 51/0003; H01L 51/0005
See application file for complete search history.

(56) References Cited

U.S. PATENT DOCUMENTS

| | | | | |
|---|---|---|---|---|
| 2011/0240933 | A1* | 10/2011 | Jung | ................... H01L 51/0003 252/519.21 |
| 2014/0053637 | A1* | 2/2014 | Quillien | ............... G01N 1/2035 73/54.01 |
| 2014/0283928 | A1* | 9/2014 | Tamate | ................. G01F 11/284 137/389 |

FOREIGN PATENT DOCUMENTS

| | | |
|---|---|---|
| KR | 10-2010-0030590 A | 3/2010 |
| KR | 10-2012-0006921 A | 1/2012 |

* cited by examiner

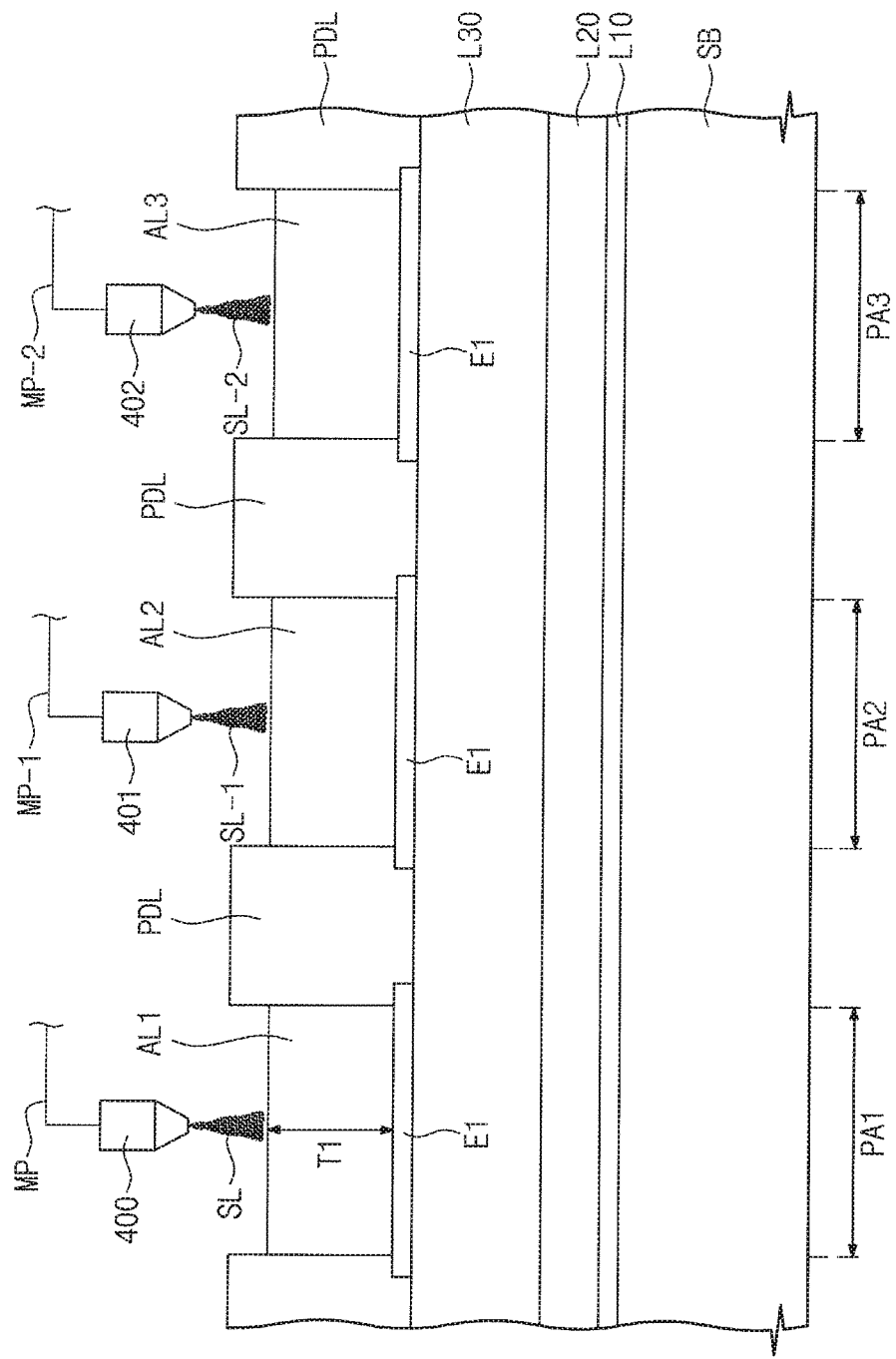

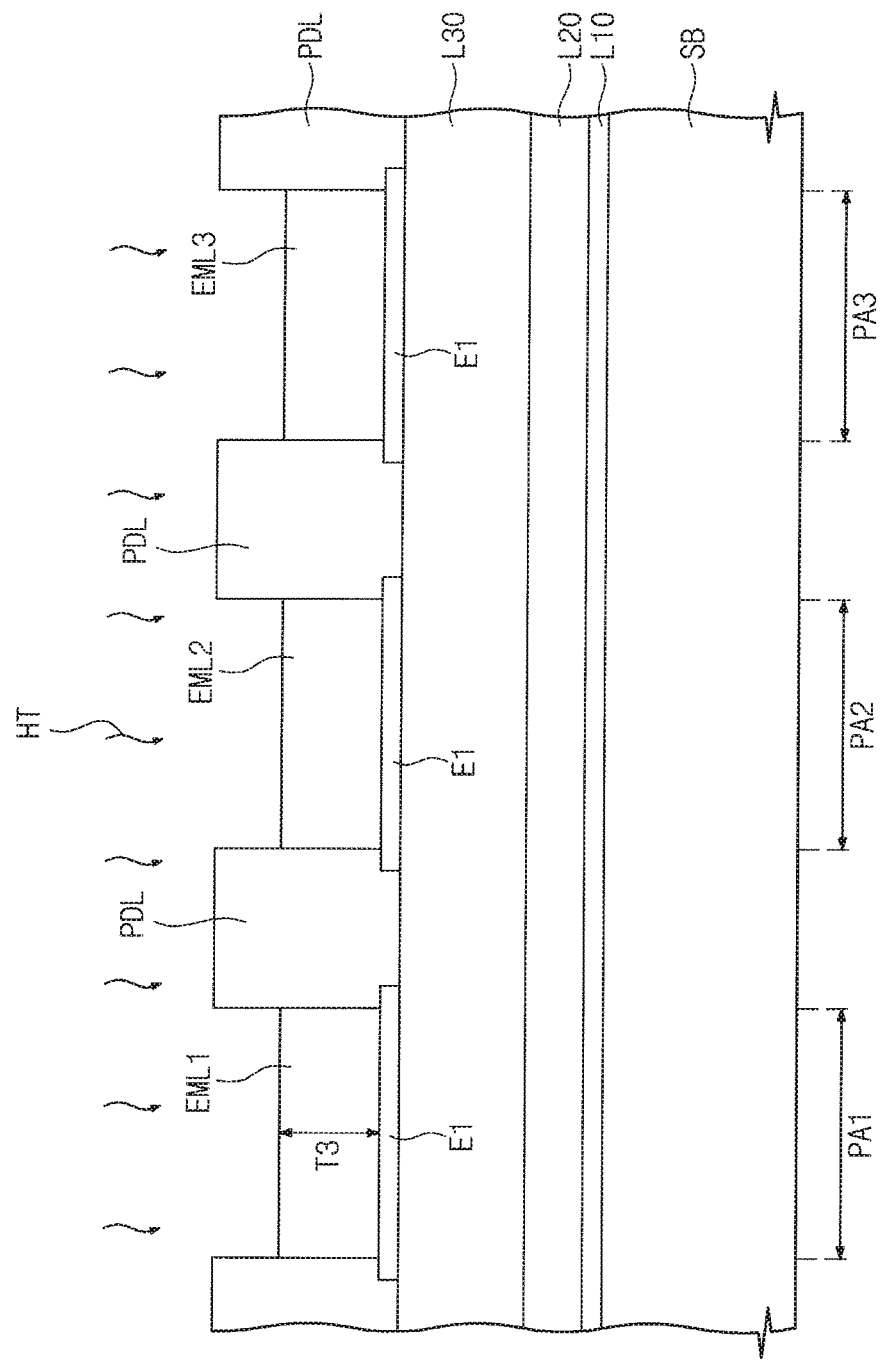

SOLUTION-PROVIDING APPARATUS AND METHOD OF MANUFACTURING ORGANIC LIGHT-EMITTING DIODE (OLED) DISPLAY USING THE APPARATUS

CROSS-REFERENCE TO RELATED APPLICATIONS

This application is a divisional application which claims priority under 35 U.S.C. §120 to and the benefit of U.S. patent application Ser. No. 14/493,223 which claims priority to and the benefit of Korean Patent Application No. 10-2014-0016144, filed on Feb. 12, 2014, the entire contents of each of which are hereby incorporated by reference in their entirety.

BACKGROUND

Field

The described technology generally relates to a solution-providing apparatus and a method of manufacturing an organic light-emitting diode (OLED) display using the apparatus.

Description of Related Technology

An OLED display is a type of flat panel display that has recently been replacing liquid crystal displays (LCD). Because the OLED display is self-emissive, it does not need a separate backlight unit that generates light. Thus, the OLED display is typically thinner than the LCD, and the usage of the OLED display is expanding.

In general, the OLED display includes an anode, a cathode, and an organic emission layer that is formed between the anode and the cathode. During operation, holes are provided to the organic emission layer through the anode, and electrons are provided to the organic emission layer through the cathode. Thus, the electrons and holes are combined to generate an exciton, and light is generated from the organic emission layer due to energy generated as the exciton is changed from an excited state to a ground state.

SUMMARY OF CERTAIN INVENTIVE ASPECTS

One inventive aspect is an apparatus that can measure the concentration of provided solution.

Another aspect is a method of manufacturing an organic light-emitting diode (OLED) display by using the apparatus for providing the solution.

Another aspect is an apparatus for providing solution onto a substrate include a storage unit, a spraying unit, a pipe, an emission-inducing unit, and a spectrometer. The storage unit stores the solution, the spraying unit is connected to the storage unit and provides the solution to the substrate, and the pipe provides a flow path through which the solution flows, to connect the storage unit to the spraying unit. Also, the emission-inducing unit provides energy to the solution flowing through the pipe to induce the generation of a light from the solution, and the spectrometer measures the wavelength and intensity of the light generated from the solution.

Also, the solution-providing apparatuses can further include a control unit that analyzes the concentration of the solution based on the wavelength and intensity of the light measured by the spectrometer, and adjusts the amount of the solution sprayed from the spraying unit depending on an analyzed concentration.

Another aspect is a method of manufacturing an OLED display include forming a first electrode on each of a plurality of pixel areas, wherein the plurality of pixel areas are defined on a substrate; providing solution onto the first electrode; curing the solution to form an organic emission layer on the first electrode; forming a second electrode on the organic emission layer; and measuring the concentration of the solution. The measuring of the concentration of the solution is as follows. Energy is provided to the solution to generate a light from the solution before providing the solution onto the first electrode, measures the wavelength and intensity of the light generated from the solution.

Another aspect is a solution-providing apparatus for providing solution onto a substrate, the apparatus comprising a storage unit configured to store the solution that includes a light emissive material, a spraying unit configured to spray the solution toward the substrate, a pipe interconnecting the storage unit and the spraying unit, an emission-inducing unit configured to excite the light emissive material of the solution that flows through the pipe so as to emit light from the solution, and a spectrometer configured to measure the wavelength and intensity of the light.

The above apparatus further comprises a controller configured to i) determine the concentration of the solution based on the measured wavelength and intensity of the light, and ii) adjust the amount of the sprayed solution based on the determined concentration. In the above apparatus, the controller is further configured to i) compare the intensity of the light to a predetermined value, and ii) increase the amount of the solution provided from the spraying unit when the determined concentration is less than a predetermined concentration.

The above apparatus further comprises a bypass pipe branched off of the pipe and connected to the storage unit and a valve connected to the bypass pipe and configured to control the flow of the solution that flows through the bypass pipe, wherein the controller is further configured to open and close the valve so as to control the flow of the solution flowing through the pipe when the determined concentration is less than the predetermined concentration.

In the above apparatus, the emission-inducing unit is further configured to apply an electric field to the solution. In the above apparatus, the emission-inducing unit comprises an anode arranged on one side of the pipe and a cathode arranged on the other side of the pipe, wherein the cathode and the anode are configured to generate the electric field.

In the above apparatus, the pipe comprises a light transmitting unit configured to transmit the light to the spectrometer. In the above apparatus, the emission-inducing unit comprises a light source configured to emit light to the solution, wherein the emission-inducing unit is further configured to apply an optical energy to the solution.

In the above apparatus, the pipe comprises a light transmitting unit configured to transmit the light to the spectrometer.

In the above apparatus, the emitted light is ultraviolet light.

In the above apparatus, the pipe comprises a main pipe connecting the storage unit to the spraying unit and a sub pipe branched from the main pipe, wherein the emission-inducing unit is further configured to excite the light emission material of the solution flowing through the sub pipe.

Another aspect is a method of manufacturing an organic light-emitting diode (OLED) display, the method comprising forming a first electrode in each of a plurality of pixel areas, wherein the pixel areas are defined on a substrate, depositing a solution that includes a light emissive material onto the first electrode, exciting the light emissive material of the solution so as to emit light from the solution before depositing the solution onto the first electrode, measuring the wavelength and intensity of the emitted light, curing the solution so as to form an organic emission layer over the first electrode, and forming a second electrode over the organic emission layer.

The above method further comprises determining the concentration of the solution and controlling the amount of the solution provided onto the first electrode based on the determined concentration.

The above method further comprises comparing the intensity of the light to a preset value and increasing the amount of the solution when the determined concentration is lower than a predetermined concentration.

In the above method, the excitation includes irradiation of light that causes the light to be emitted from the solution.

In the above method, the irradiated light is ultraviolet light.

The above method further comprises transmitting the irradiated light and the emitted light to a spectrometer configured to perform the measuring.

In the above method, the exciting comprises applying an electrical energy to the solution. In the above method, the electrical energy is generated by electrodes that are arranged on a pipe through which the solution flows. The above method further comprises transmitting the emitted light to a spectrometer that performs the measuring.

BRIEF DESCRIPTION OF THE DRAWINGS

FIGS. 7A to 7E represent a method of manufacturing an organic light-emitting diode (OLED) display by using the apparatus for providing the solution shown in FIG. 1.

DETAILED DESCRIPTION OF CERTAIN INVENTIVE EMBODIMENTS

Figure 1:
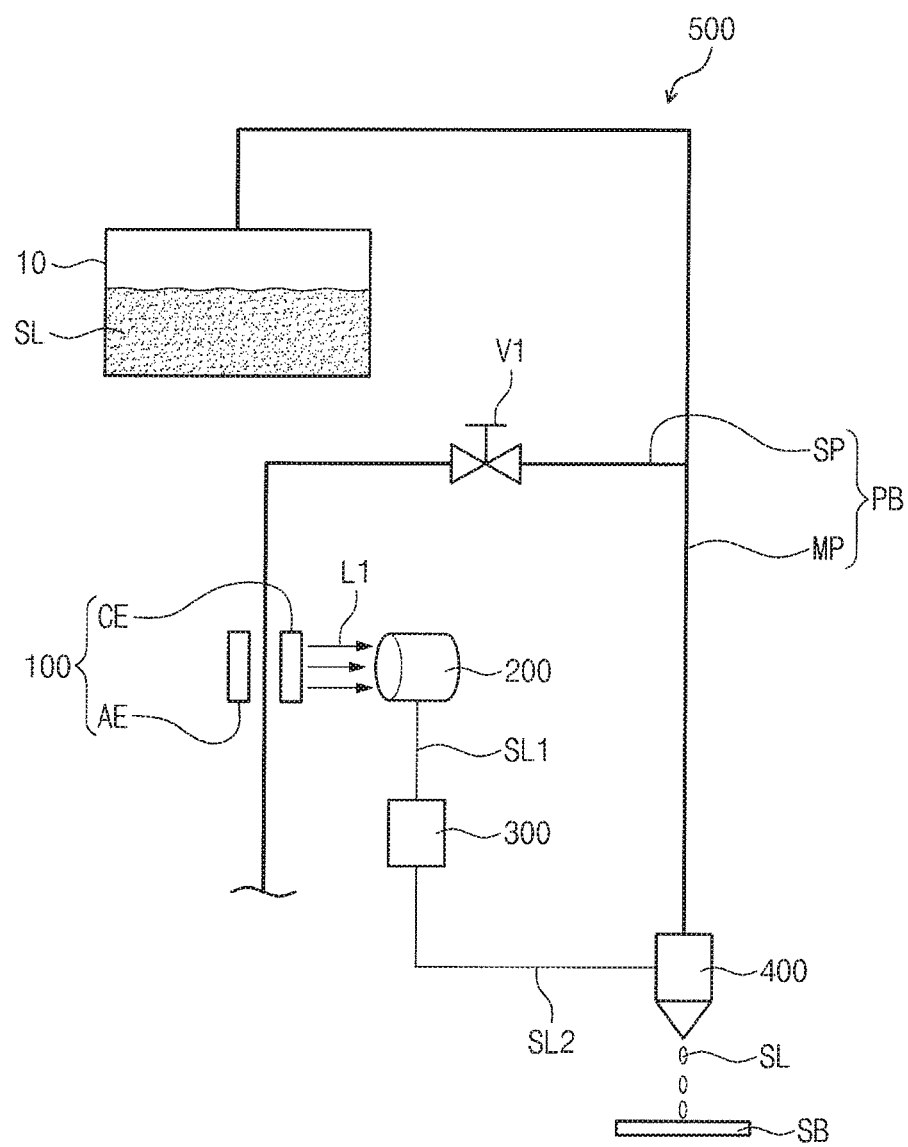
FIG. 1 is a schematic diagram of a solution-providing apparatus according to an embodiment.

Embodiments of the described technology are described below in detail with reference to the accompanying drawings. The above objectives, characteristics and effects of the described technology will be easily understood through the following embodiments to be described with reference to the accompanying drawings. However, the described technology is not limited to embodiments to be described below but can be implemented through various applications and variations. Rather, the embodiments of the described technology to be described below are provided to make the technical spirit disclosed herein clearer and fully convey the scope of the described technology to a person skilled in the art. Thus, the scope of the described technology should not be construed as being limited by embodiments to be described below. The same reference numerals denoted in the following embodiments and the accompanying drawings represent the same components.

Also, the terms a "first", a "second", etc. used herein are not used as limited meanings but used for the purpose of distinguishing one component from another component. When a portion of a layer, an area, or a component is referred to as being "on" another portion, it can be directly on the other portion or intervening layers, areas, or components can also be present. In this disclosure, the term "substantially" includes the meanings of completely, almost completely or to any significant degree under some applications and in accordance with those skilled in the art. Moreover, "formed on" can also mean "formed over."

Figure 2:
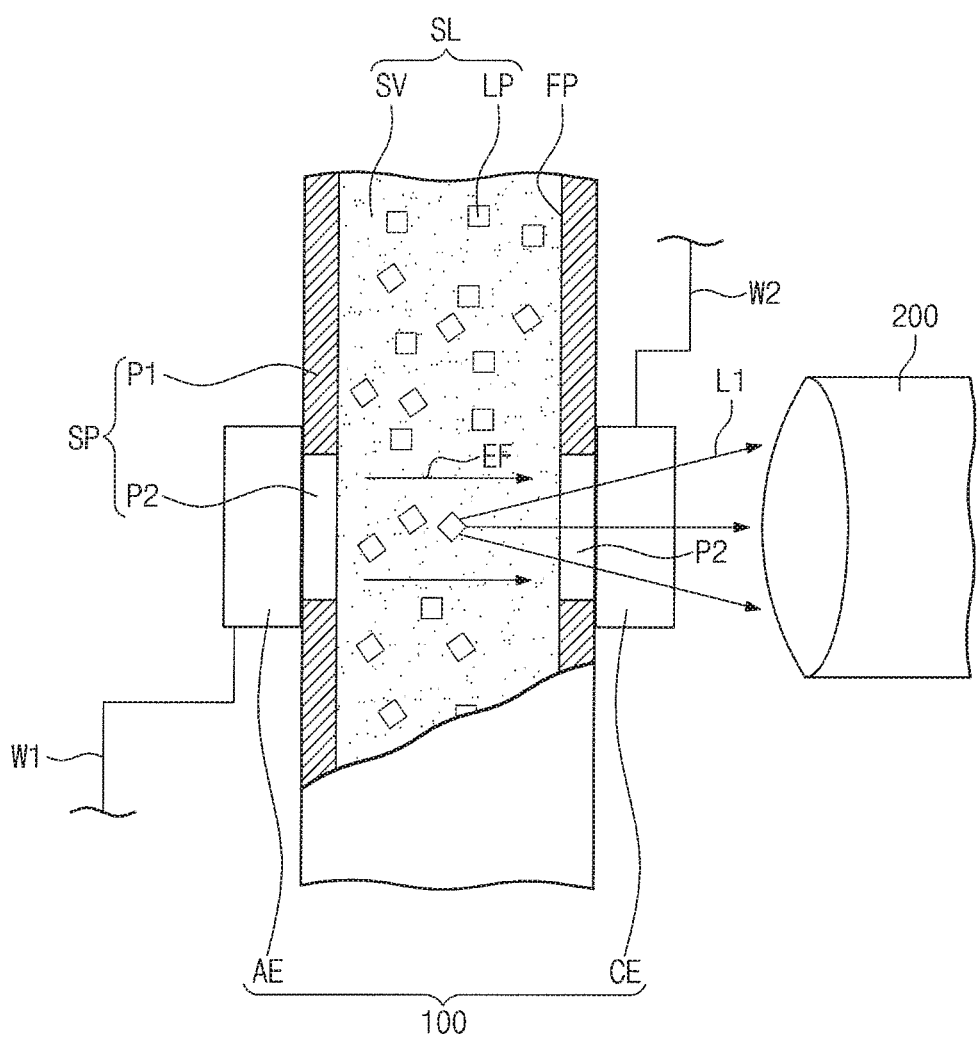
FIG. 2 is an enlarged view of a portion of a pipe coupled to an emission-inducing unit shown in FIG. 1.

FIG. 1 is a schematic diagram of a solution-providing apparatus according to an embodiment of the described technology. FIG. 2 is an enlarged view of a portion of a pipe coupled to an emission-inducing unit shown in FIG. 1.

Figure 7A:
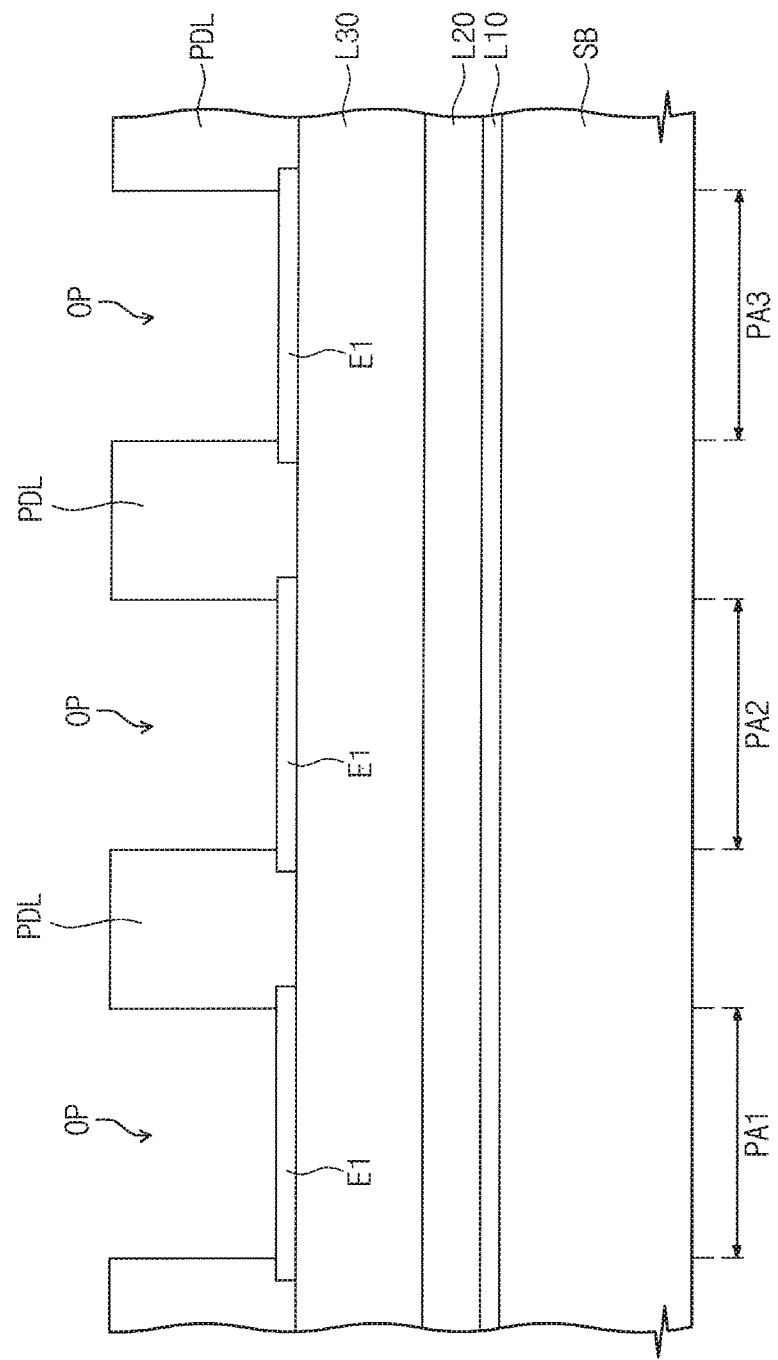
Figure 7C:
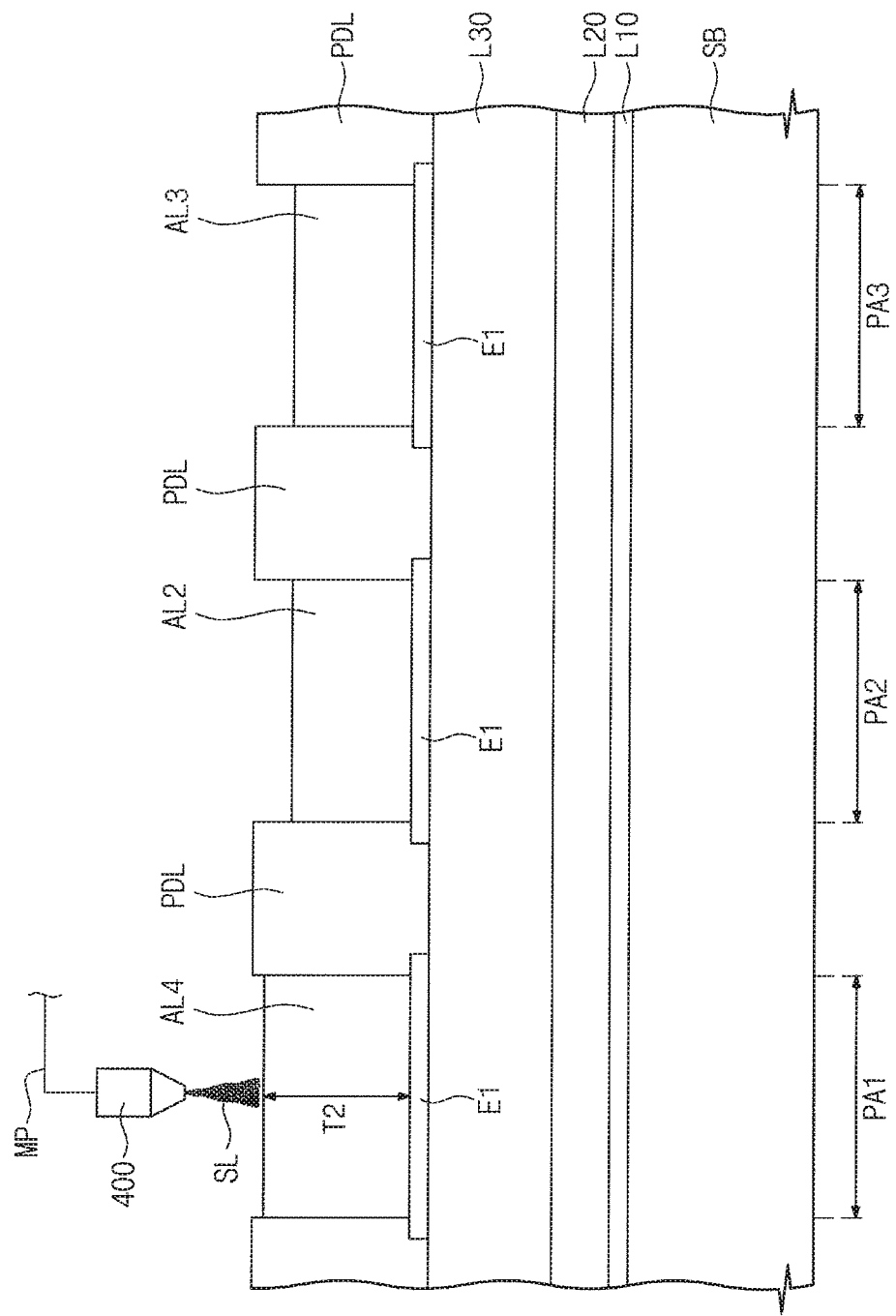
Figure 7E:
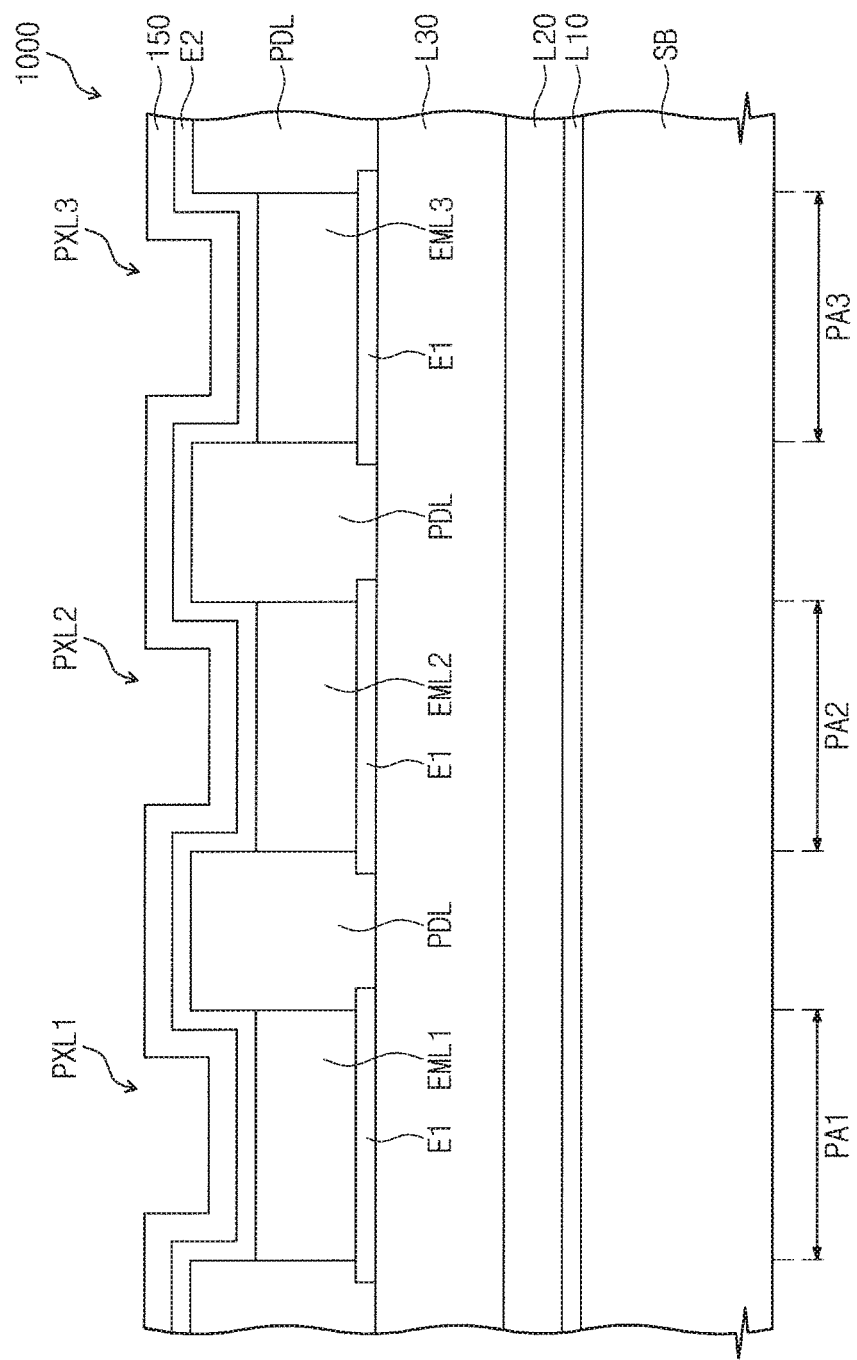

Referring to FIGS. 1 and 2, a solution-providing apparatus 500 in the present embodiment can be used for manufacturing an organic light-emitting diode (OLED) display 1000 (of FIG. 7E). The solution-providing device 500 can provide solution SL to a substrate SB and can thus be used for forming the organic emission layers EML1 to EML3 (of FIG. 7E) of the OLED display.

The solution-providing apparatus 500 includes a storage unit 10, an emission-inducing unit 100, a spectrometer 200, a spraying unit 400, a pipe PB, a first valve V1 and a control unit or controller 300.

The storage unit can receive and store the solution SL. In some embodiments, the solution SL can be provided onto the substrate SB and then cured so that the organic emission layers can be formed. The solution SL can include solvent SV and an emissive material LP. The emissive material LP can include a fluorescent material or a phosphorous material and the solvent SV can have an electrolytic characteristic so that an electric field EF can be applied to the solution SL.

The spraying unit 400 is connected to the storage unit 10 via the pipe PB, and the spraying unit 400 provides the solution SL onto the substrate SB. The spraying unit 400 can be a nozzle that sprays the solution SL by using an inkjet technique.

The pipe PB provides a flow path FP through which the solution SL flows. The pipe PB connects the storage unit to the spraying unit 400. The pipe PB includes a main pipe MP and a sub pipe SP. The main pipe MP connects the storage unit 10 to the spraying unit 400. The sub pipe SP branches out of the main pipe MP and extends to the emission-inducing unit 100.

The first valve V1 is coupled to the sub pipe SP and can control the flow of the solution SL that flows through the sub pipe SP. For example, when the first valve V1 is closed, the flow of the solution SL can be blocked by the first valve V1. Also, when the first valve V1 is open, the solution SL stored in the storage unit 10 can be provided toward the emission-inducing unit 100 through the main pipe MP and the sub pipe SP.

The emission-inducing unit 100 is arranged to be adjacent to the sub pipe SP, and the emission-inducing unit 100 applies an electric field EF to the solution SL flowing through the sub pipe SP to induce the generation of a light L1 from the solution SL. The emission-inducing unit 100 can apply an electric field to the solution SL to induce the generation of the light L1 from the solution SL. The emission-inducing unit 100 can include an anode AE and a cathode CE.

The anode AE is arranged on one side of the sub pipe SP, and the cathode CE is arranged on the other side of the sub pipe so as to generate an electric field EF. The electric field EF is applied to the solution SL. In some embodiments, the anode AE and the cathode CE can be arranged to face each other in the sub pipe SP. The principle of inducing the generation of the light L1 by the emission stimulating unit 100 is as follows.

An electrical signal or voltage is applied to the anode AE through a first wire W1 electrically connected to the anode AE and an electrical signal or voltage is applied to the cathode CE through a second wire W2 electrically connected to the cathode CE. The electric field EF can be generated by the potential difference between the anode AE and the cathode CE. In this case, a hole is provided to the emissive material LP through the solvent SV, and an electron is provided to the emissive material LP through the cathode CE and the solvent SV. Thus, the electron and the hole provided to the organic emission layer are combined to generate an exciton, and light is generated from the emissive material LP by energy generated as the exciton is changed from an excited state to a ground state.

In some embodiments, the sub pipe SP can include a light shielding unit P1 and a light transmitting unit P2. The light shielding unit P1 can be formed of a plastic material such as poly vinyl chloride (PVC) and the light transmitting unit P2 can be formed of a material such as quartz so as to transmit the light L1. Thus, the light L1 generated from the emissive material LP can pass through the light transmitting unit P2 and be emitted to the outside of the sub pipe SP.

The spectrometer 200 can receive the light L1 and can measure the wavelength and intensity of the light L1. The spectrometer 200 can split the light L1 into optical components depending on its wavelength and can measure the intensity of the optical components obtained through the splitting. Related descriptions are provided in more detail with reference to FIGS. 3A to 3C.

The control unit 300 can receive information on the wavelength and intensity of the light L1 through a first signal line SL1 and the control unit 300 can analyze or determine the concentration of the solution SL based on the information. Also, the control unit 300 can provide a control signal to the spraying unit 400 through a second signal line SL2 based on an analyzed concentration. The amount of the solution SL sprayed from the spraying unit 400 can be adjusted by the control signal.

For example, when the analyzed concentration is lower than a preset concentration, the control unit 300 can transmit a control signal to the spraying unit 400 through the second signal line SL2 so as to increase the amount of the solution SL sprayed from the spraying unit 400. Also, when the analyzed concentration is higher than a preset concentration, the control unit 300 can transmit a control signal to the spraying unit 400 through the second signal line SL2 so as to decrease the amount of the solution SL sprayed from the spraying unit 400.

A method of analyzing the concentration of the solution SL by the control unit 300 in linkage with the spectrometer is as follows.

Figure 3A:
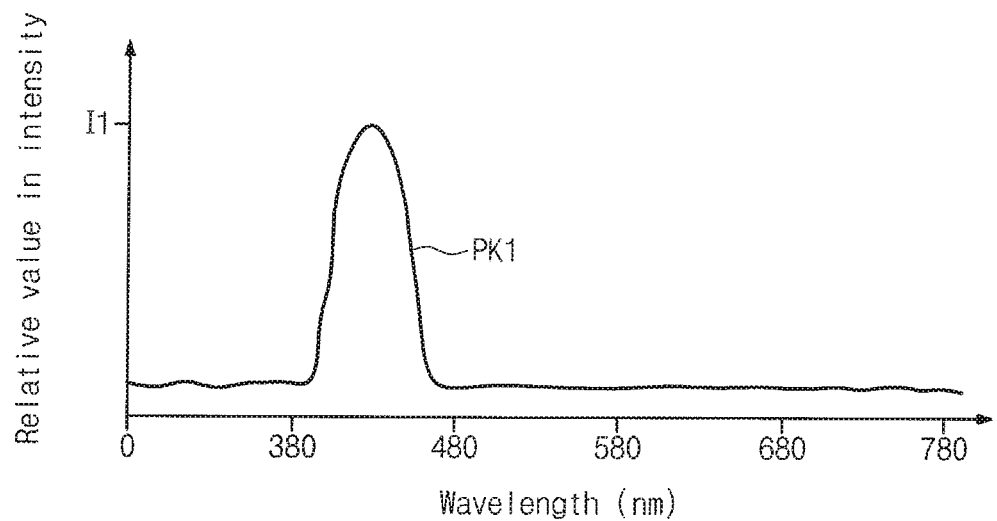
FIGS. 3A to 3C are graphs that represent the wavelengths and intensities of lights measured by a spectrometer shown in FIG. 1.
Figure 3B:
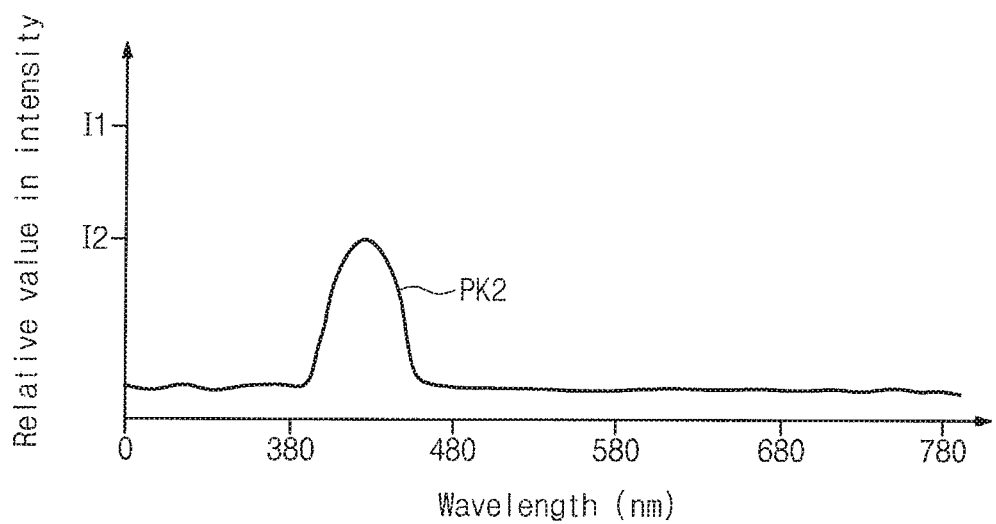
Figure 3C:
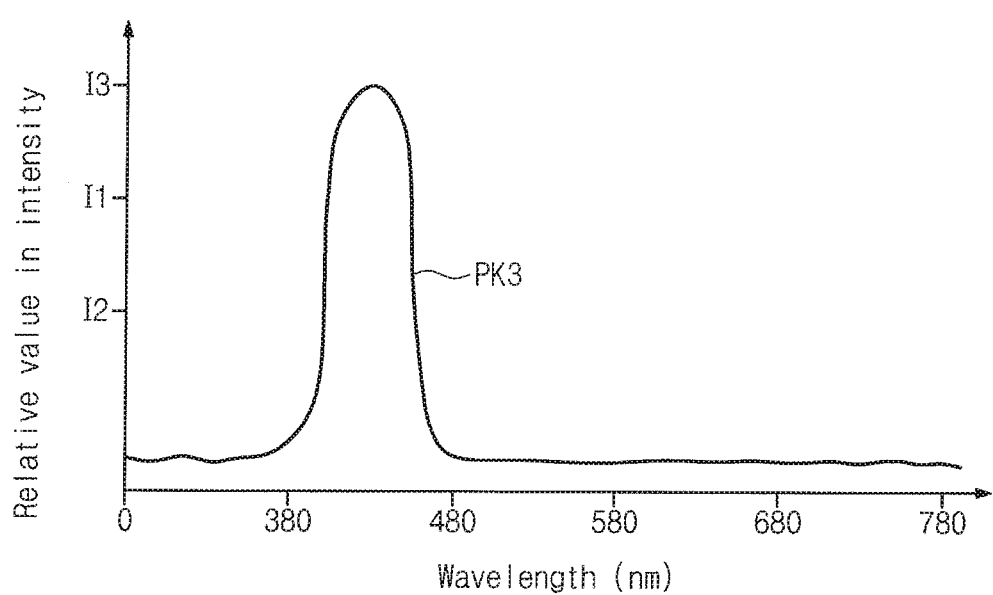

FIGS. 3A to 3C are graphs that represent the wavelengths and intensities of light measured by a spectrometer shown in FIG. 1.

Referring to FIGS. 1, 2 and 3A, wavelength vs. intensity of the light L1 split into a plurality of optical components by the spectrometer 200 is shown. More specifically, the x-axis of the graph shown in FIG. 3A represents the wavelength of the light L1 in units of nanometers (nm), and the y-axis of the graph represents the intensity of the light L1 with relative values.

Referring to a first peak PK1 represented in the graph, the wavelength of the first peak PK1 is about 400 nm to about 480 nm that corresponds to the wavelength of a blue light, and the intensity of the first peak PK1 is represented by a first intensity I1.

When the amount of the solution SL flowing through the flow path FP of the sub pipe SP per unit time is controlled to be constant, the frequency and efficiency of the light L1 increase as the amount of the emissive material LP in the solution SL increases. Therefore, the first intensity I1 can increase. Thus, the relative value of a first concentration of the amount of the emissive material LP contained in the solution SL can be defined based on the first intensity I1 of the first peak PK1.

Also, the proper concentration obtained by quantitatively analyzing the solution SL by using another method can be predetermined. Referring to FIGS. 3A to 3C, it is assumed that the control unit 300 sets the first concentration to the proper concentration.

Referring to a second peak PK2 shown in FIG. 3B, the wavelength of the second peak PK2 is about 400 nm to about 480 nm that corresponds to the wavelength of a blue light. The intensity of the second peak PK2 is represented by a second intensity I2 that is less than the first intensity I1. When defining a second concentration of the solution SL based on the second intensity I2, the control unit 300 can determine that the second concentration is less than the proper concentration.

Referring to a third peak PK3 of the graph shown in FIG. 3C, the wavelength of the third peak PK3 is about 400 nm to about 480 rim that corresponds to the wavelength of a blue light. However, the intensity of the third peak PK3 is represented by a third intensity I3 that is greater than the first intensity I1. When defining a third concentration of the solution SL based on the third intensity I3 of the third peak PK3, the control unit 300 can determine that the third concentration is greater than the proper concentration.

The solution SL includes the solvent SV and the emissive material LP. After the solution SL is sprayed, the solvent SV can be removed by a thermal treatment process. For example, when attempting to form any layer on the substrate SB by using the solution SL, the solution SL is first sprayed onto the substrate SB by using the spraying unit 400 and then the sprayed solution SL can be thermally treated to remove the solvent SV from the solution SL. As a result, the emissive material LP can remain on the substrate SB so as to form the layer on the substrate SB and little solvent SV remains on the layer.

Thus, when the concentration of the solution SL is analyzed by the spectrometer 200 and the control unit 300 as described with reference to FIGS. 3A to 3C, there is no need to correct the amount of the solution SL provided to the substrate SB based on the concentration. For example, when the concentration of the solution SL is less than the preset concentration, the control unit 300 can transmit a control signal to the spraying unit 400 so as to increase the amount of the solution SL sprayed from the spraying unit 400. Thus, when the concentration of the solution SL, the amount of the solution SL provided to the substrate SB and the amount of the emissive material LP contained in the solution SL increase, it is possible to prevent the thickness of a layer from decreasing.

As another example, when the concentration of the solution SL is greater than the preset concentration, the control unit 300 can transmit a control signal to the spraying unit 400 so as to decrease the amount of the solution SL sprayed from the spraying unit 400. Thus, when the concentration of the solution SL is high and when the amount of the solution SL provided to the substrate SB and the amount of the emissive material LP contained in the solution SL decrease, it is possible to prevent the thickness of a layer from increasing.

Figure 4:
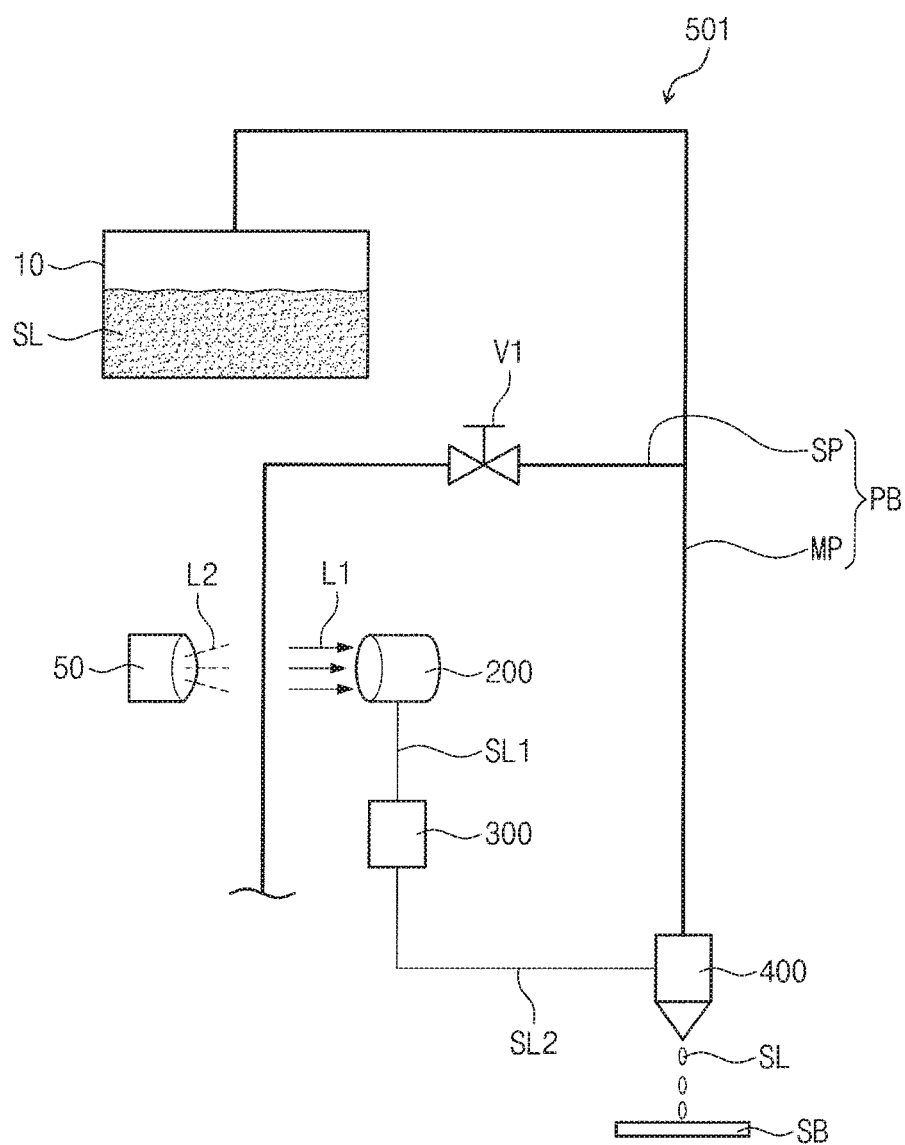
FIG. 4 is a schematic diagram of a solution-providing apparatus according to another embodiment.
Figure 5:
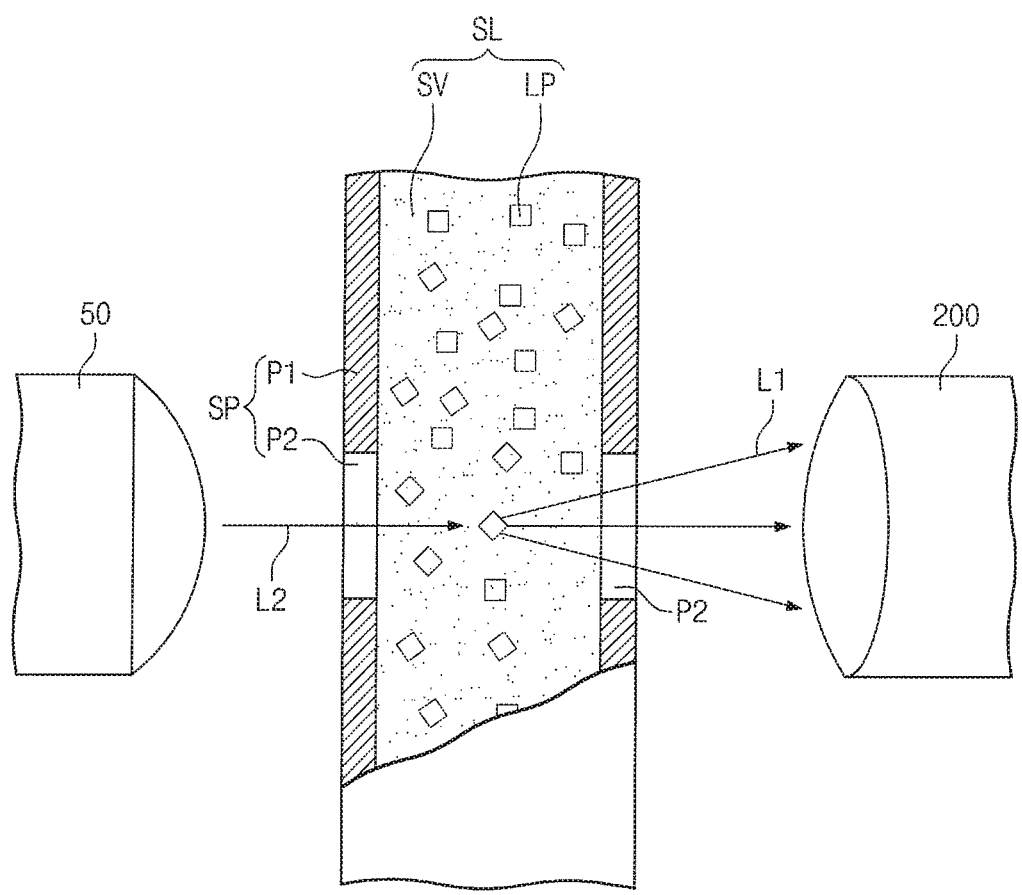
FIG. 5 is an enlarged view of a portion of a pipe coupled to an emission-inducing unit shown in FIG. 4.

FIG. 4 is a schematic diagram of a solution-providing apparatus according to another embodiment of the described technology. FIG. 5 is an enlarged view of a portion of a pipe coupled to the emission-inducing unit shown in FIG. 4. In describing FIGS. 4 and 5, the components described above are denoted by the reference numerals and their detailed descriptions are left out.

Referring to FIGS. 4 and 5, a solution-providing apparatus 501 includes an emission-inducing unit 50. But unlike the embodiment shown in FIG. 1, the emission-inducing unit 50 provides optical energy to the solution SL that flows through the sub pipe SP. In some embodiments, the emission-inducing unit 50 can be a light source that radiates a radiant light L2, and the emission-inducing unit 50 provides the radiant light L2 to the solution SL and absorbs energy from the radiant light L2 to generate the light L1. In some embodiments, the wavelength of the radiant light L2 can be less than the wavelength of a visible light. The radiant light L2 can be ultraviolet radiation.

Like the embodiment previously described with reference to FIGS. 1 and 2, the spectrometer 200 receives the light L1 and measures the wavelength and intensity of the light L1. Also, the control unit 300 receives information on the wavelength and intensity of the light L1 measured by the spectrometer 200 through the first signal line SL1. The control unit 300 analyzes the concentration of the solution SL based on the information. Also, the control unit 300 can provide a control signal to the spraying unit 400 through the second signal line SL2 based on an analyzed concentration. The amount of the solution sprayed from the spraying unit 400 can be adjusted by the control signal.

Figure 6:
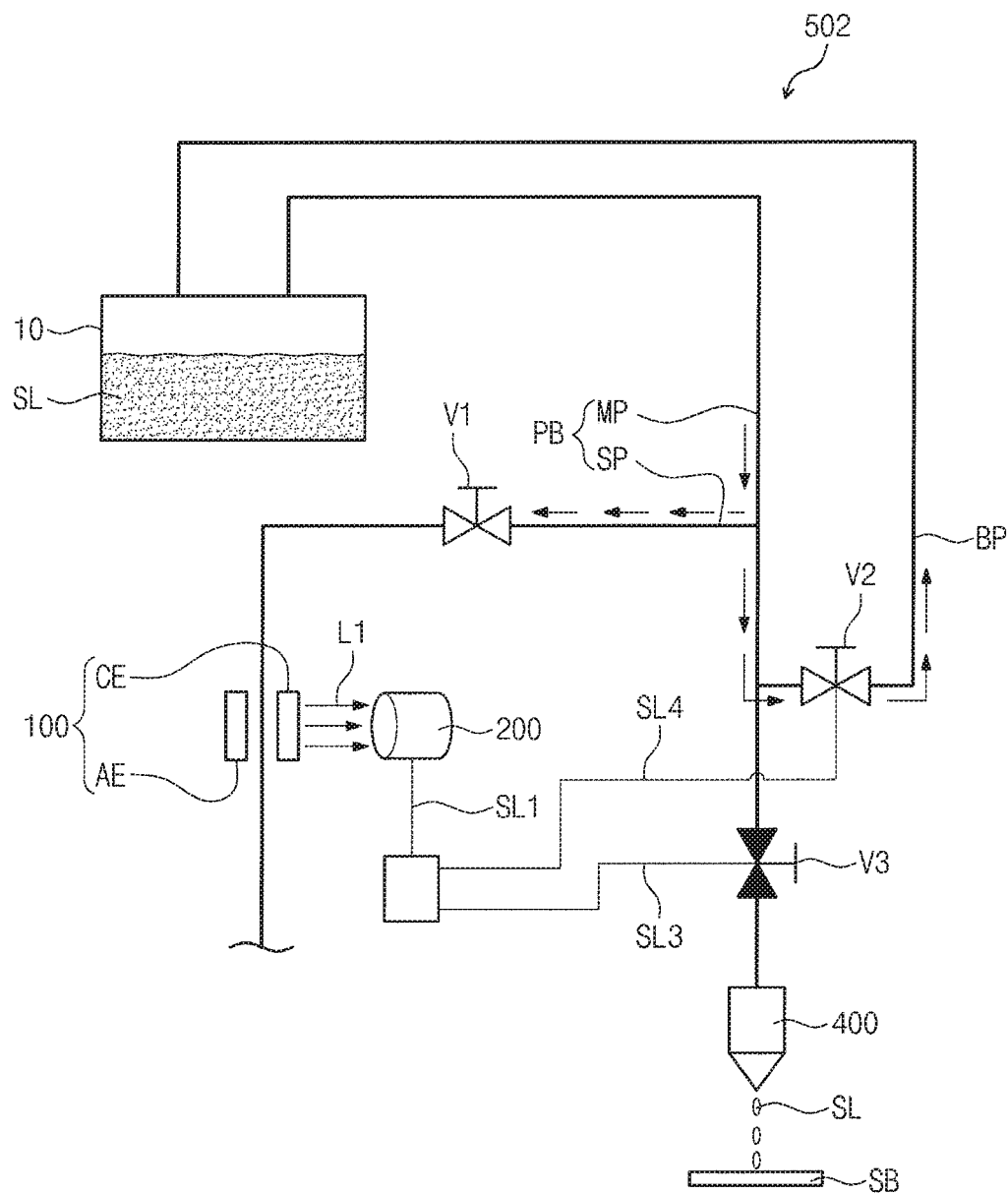
FIG. 6 is a schematic diagram of a solution-providing apparatus according to another embodiment.

FIG. 6 is a schematic diagram of a solution-providing apparatus according to another embodiment of the described technology. In describing FIG. 6, the components described above are denoted by the reference numerals and their detailed descriptions are left out.

Referring to FIG. 6, a solution-providing apparatus 502 includes the storage unit 10, an emission-inducing unit 100, the spectrometer 200, the control unit 300, the spraying unit 400, a main pipe MP, a bypass pipe BP, first to third valves V1 to V3, a third signal line SL3, and a fourth signal line SL4.

The bypass pipe BP is branched out of the main pipe MP and connected to the storage unit 10. The second valve V2 is connected to the bypass pipe BP and can control the flow of the solution SL that flows through the bypass pipe BP. Also, the third valve V3 is connected to the main pipe BP and can control the flow of the solution SL that flows through the main pipe MP.

For the solution-providing apparatus 502 having a configuration described above, when the first valve V1 opens, the solution SL is provided to the emission-inducing unit 100, and the concentration of the solution SL is analyzed by the control unit 300 after the light has been received by the spectrometer 200. As previously described with reference to FIGS. 3A to 3C, when the concentration of the solution SL is not the proper concentration, the control unit 300 can transmit a control signal to the third valve V3 through the third signal line SL3 to close the third valve V3. As a result, the flow of the solution SL provided to the spraying unit 400 can be blocked.

Also, the control unit 300 can transmit the control signal to the second valve V2 through the fourth signal line SL4 to open the second valve V2. Thus, the solution SL flowing through the main pipe MP is collected in the storage unit through the bypass pipe BP. As previously described, it is possible to perform an operation to correct the concentration of the solution SL stored in the storage unit 10 when the solution SL does not have the proper concentration collected in the storage unit 10. Thus, it is possible to prevent the solution SL that does not have the proper concentration from becoming provided to the spraying unit 400.

FIGS. 7A to 7E represent a method of manufacturing an organic light-emitting diode (OLED) display by using the apparatus for providing the solution shown in FIG. 1. In describing FIGS. 7A to 7E, the components described above are denoted by the reference numerals and their detailed descriptions are left out.

Referring to FIG. 7A, first to third pixel areas PA1 to PA3 are defined on the substrate SB. A gate insulating layer L10, an interlayer insulating layer L20, and a planarization layer L30 are formed on the substrate SB. First to third pixels PXL1 to PXL3 (of FIG. 7E) are formed on the first to third pixel areas PA1 to PA3. Although not shown in FIG. 7A, a driving transistor is formed on each of the first to third pixel areas PA1 to PA3 before forming the planarization layer L30 so that it is possible to switch the driving of the first to third pixels PXL1 to PXL3 (of FIG. 7E).

After the planarization layer L30 is formed, a first electrode E1 is formed on each of the first to third pixel areas PA1 to PA3, and a pixel defining layer PDL is formed. Openings OP can be formed on the pixel definition layer PDL to face the first to third pixel areas PA1 to PA3, respectively.

Referring to FIG. 7B, first to third extra emission layers AL1 to AL3 are respectively formed on the first to third pixel areas PA1 to PA3. A method of forming the first to third extra emission layers AL1 to AL3 is as follows.

The solution SL is provided onto the first electrode E1 arranged on the first pixel area PA1 by using the spraying unit 400. As a result, the first extra emission layer AL1 having a first thickness T1 is formed. Also, other solutions SL-1 and SL-2 are provided to the second and third pixel areas PA2 and PA3 by using other spraying units 401 and 402 that are one-to-one connected to other pipes MP-1 and MP-2. As a result, the second and third extra emission layer AL2 and AL3 are respectively formed on the second and third pixel areas PA2 and PA3.

In some embodiments, the first to third pixels PXL1 to PXL3 (of FIG. 7E) that emit lights of different colors can be formed on the first to third pixel areas PA1 to PA3. In this case, the first extra emission layer AL1 can include, e.g., a red emissive material and solvent, the second extra emission layer AL2 can include, e.g., a green emissive material and solvent, and the third extra emission layer AL3 can include, e.g., a blue emissive material and solvent.

Referring to FIGS. 1 and 7C, when the concentration of the solution SL is less than the proper concentration, the control unit 300 can transmit a control signal to the spraying unit 400 so that the spraying unit 400 can further provide the solution SL to the first pixel area PA1. As a result, the solution SL can be provided to the first extra emission layer AL1 (of FIG. 7B) so as to form a fourth extra emission layer AL4. A second thickness T2 of the fourth extra emission layer AL4 is greater than the first thickness T1 of the first extra emission layer AL1.

Referring to FIG. 7D, the first to third emission layers EML1 to EML3 are formed by performing a thermal treatment process in which heat HT is applied to the second to fourth extra emission layers AL2 to AL4 (of FIG. 7C). Because each of the second to fourth extra emission layers has a liquid state in which solvent and an emissive material are included, the solvent is removed by the thermal treatment process. The emissive material that is a solid component remains on each of the first to third pixel areas PA1 to PA3, and as a result, the first to third emission layers EML1 to EML3 are formed.

When the predetermined thickness of the first emission layer EML1 is a third thickness T3, the solvent contained in the fourth extra emission layer AL4 (of FIG. 7C) is removed when performing the thermal treatment process and thus the third thickness T3 is less than the second thickness T2 (of FIG. 7C). Also, when the process shown in FIG. 7C is left out unlike the embodiment of the described technology, the first emission layer EML1 can have a thickness that is less than the third thickness T3. However, in the embodiment of the described technology, when the concentration of the solution (of FIG. 7C) is lower than the proper concentration, it is possible to prevent the first emission layer EML1 from having a thickness less than the third thickness T3 by increasing the amount of the solution provided to the first pixel area PA1, as seen in the process shown in FIG. 7C.

Referring to FIG. 7E, a second electrode E2 is formed on the first to third organic emission layers EML1 to EML3. As a result, the first to third pixels PXL1 to PXL3 that respectively correspond one-to-one to the first to third pixel areas PA1 to PA3 are formed. In another embodiment, a hole injection layer, a hole transport layer, an electron transport layer, and an electron injection layer can be further formed on each of the first to third pixels PXL1 to PXL3.

Then, a sealing layer 150 that substantially covers the first to third pixels PXL1 to PXL3 is formed and the manufacturing of the OLED display 1000 is completed.

According to embodiments of the described technology, before solution is provided to the substrate through the spraying unit of the solution-providing apparatus, it is possible to analyze the concentration of the solution and it is possible to correct the amount of the solution provided to the substrate based on analysis. Thus, when the solution is cured to form a layer, it is possible to prevent the thickness of the layer from becoming non-uniform due to a difference in concentration of the solution.

Also, when the solution-providing apparatus is used for manufacturing the emission layer of the OLED display, it can be easy to uniformly manufacture the thickness of the emission layer. Thus, the amount of a light generated from the emission layer can become uniform.

While the inventive technology has been described above, a person skilled in the art can understand that many modifications and variations can be made without departing from the spirit and scope of the present invention defined in the following claims. Thus, the technical scope of the present invention is not limited to those described in the detailed description but should be defined by the following claims.

What is claimed is:

1. A method of manufacturing an organic light-emitting diode (OLED) display, the method comprising:
    forming a first electrode in each of a plurality of pixel areas, wherein the pixel areas are defined on a substrate;
    depositing a solution that includes a light emissive material onto the first electrode;
    exciting the light emissive material of the solution so as to emit light from the solution before depositing the solution onto the first electrode;
    measuring the wavelength and intensity of the emitted light;
    curing the solution so as to form an organic emission layer over the first electrode; and
    forming a second electrode over the organic emission layer.

2. The method of claim 1, further comprising:
   determining the concentration of the solution; and
   controlling the amount of the solution provided onto the first electrode based on the determined concentration.

3. The method of claim 2, further comprising:
   comparing the intensity of the light to a preset value; and
   increasing the amount of the solution when the determined concentration is lower than a predetermined concentration.

4. The method of claim 1, wherein the excitation includes irradiation of light that causes the light to be emitted from the solution.

5. The method of claim 4, wherein the irradiated light is ultraviolet light.

6. The method of claim 4, further comprising transmitting the irradiated light and the emitted light to a spectrometer configured to perform the measuring.

7. The method of claim 1, wherein the exciting comprises applying an electrical energy to the solution.

8. The method of claim 7, wherein the electrical energy is generated by electrodes that are arranged on a pipe through which the solution flows.

9. The method of claim 8, further comprising transmitting the emitted light to a spectrometer that performs the measuring.

* * * * *